(12) United States Patent
Tan et al.

(10) Patent No.: US 8,154,304 B2
(45) Date of Patent: Apr. 10, 2012

(54) PCB DELIVERY APPARATUS PCB TESTING SYSTEM EMPLOYING THE SAME

(75) Inventors: Gui Tan, Shenzhen (CN); Yen-Pin Chang, Taipei Hsien (TW); Feng-Ying Xia, Shenzhen (CN); Jian-Hua Zhou, Shenzhen (CN); Peng-Xu Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 391 days.

(21) Appl. No.: 12/582,806

(22) Filed: Oct. 21, 2009

(65) Prior Publication Data

US 2010/0253362 A1 Oct. 7, 2010

(30) Foreign Application Priority Data

Apr. 2, 2009 (CN) ...................... 2009 2 0301871 U

(51) Int. Cl.
*G01R 31/02* (2006.01)

(52) U.S. Cl. .................................. 324/537; 324/757.02
(58) Field of Classification Search ........................ None
See application file for complete search history.

(56) References Cited

U.S. PATENT DOCUMENTS 5,094,584 A * 3/1992 Bullock ........................ 414/800
6,469,496 B1 * 10/2002 Khouw et al. ........... 324/750.25

* cited by examiner

*Primary Examiner* — Minh N Tang
(74) *Attorney, Agent, or Firm* — Altis Law Group, Inc.

(57) ABSTRACT

A printed circuit board (PCB) testing system includes two gear groups, a pair of transmission belts and a driver. The pair of transmission belts geared onto and driven by the two gear groups is parallel and respectively perpendicular to the PCB transmission guideway so as to define a PCB accommodation space therebetween. Each transmission belt includes a plurality of projections. The two gear groups are rotated synchronously and inversely. During operation, the projections on the pair of transmission belts, facing the PCB accommodation space, move down, the projections move away from each other and to the bottom of the corresponding transmission belts, and a PCB supported by the pair of projections drops onto the PCB transmission guideway.

18 Claims, 3 Drawing Sheets

PCB DELIVERY APPARATUS PCB TESTING SYSTEM EMPLOYING THE SAME

BACKGROUND

1. Technical Field

The present disclosure relates to device testing, and in particular to a PCB feeding equipment employed in a testing system.

2. Description of Related Art

Generally, when a large number of PCBs undergo electrical testing, only one PCB can be tested at a time. Untested PCBs must be individually placed into a testing device and tested, which is both inconvenient and inefficient.

Therefore, a need exists in the industry to overcome the described limitations.

DETAILED DESCRIPTION OF EMBODIMENTS

Figure 1:
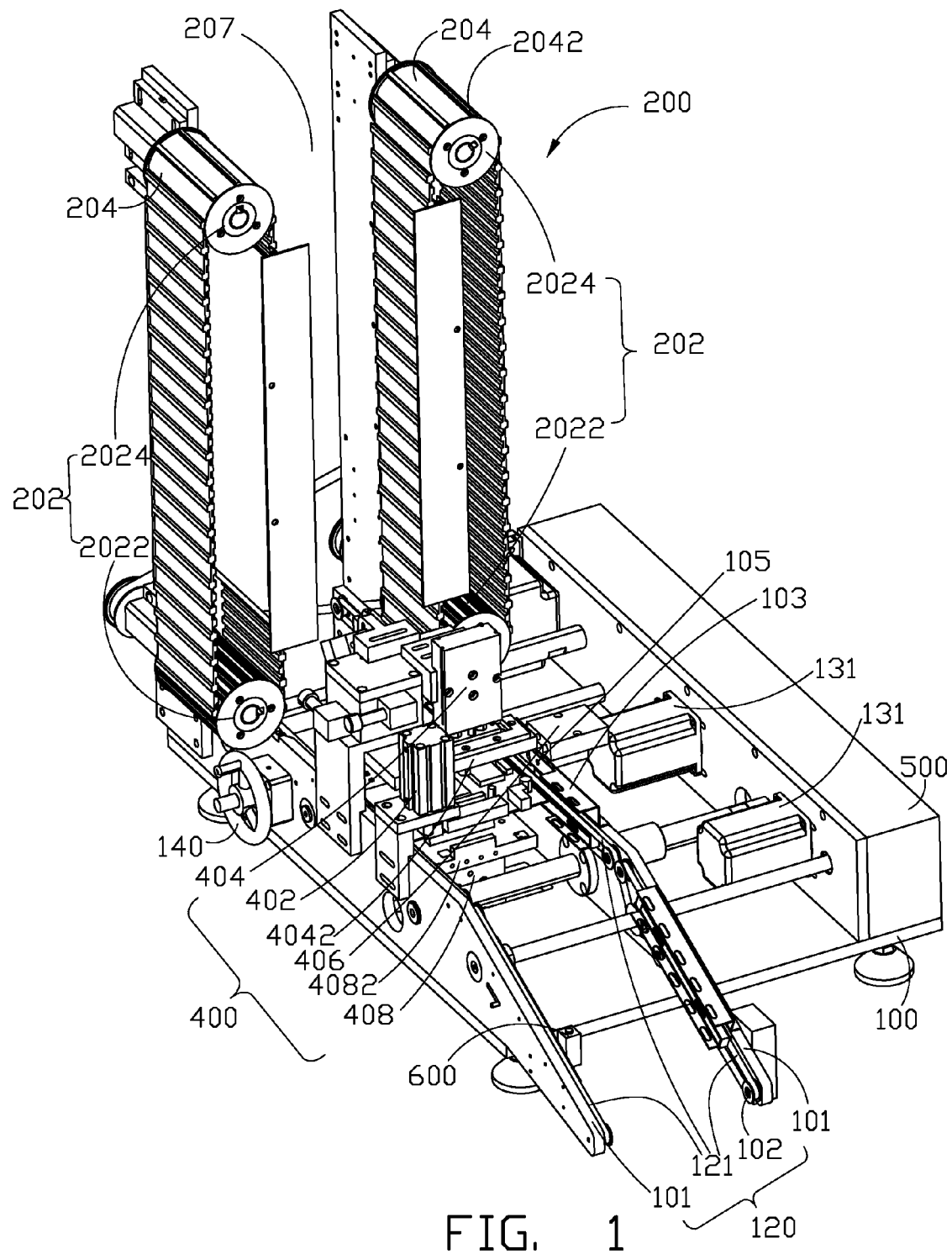
FIG. 1 is an exploded perspective view from a first direction of a PCB testing system in accordance with the disclosure.
Figure 2:
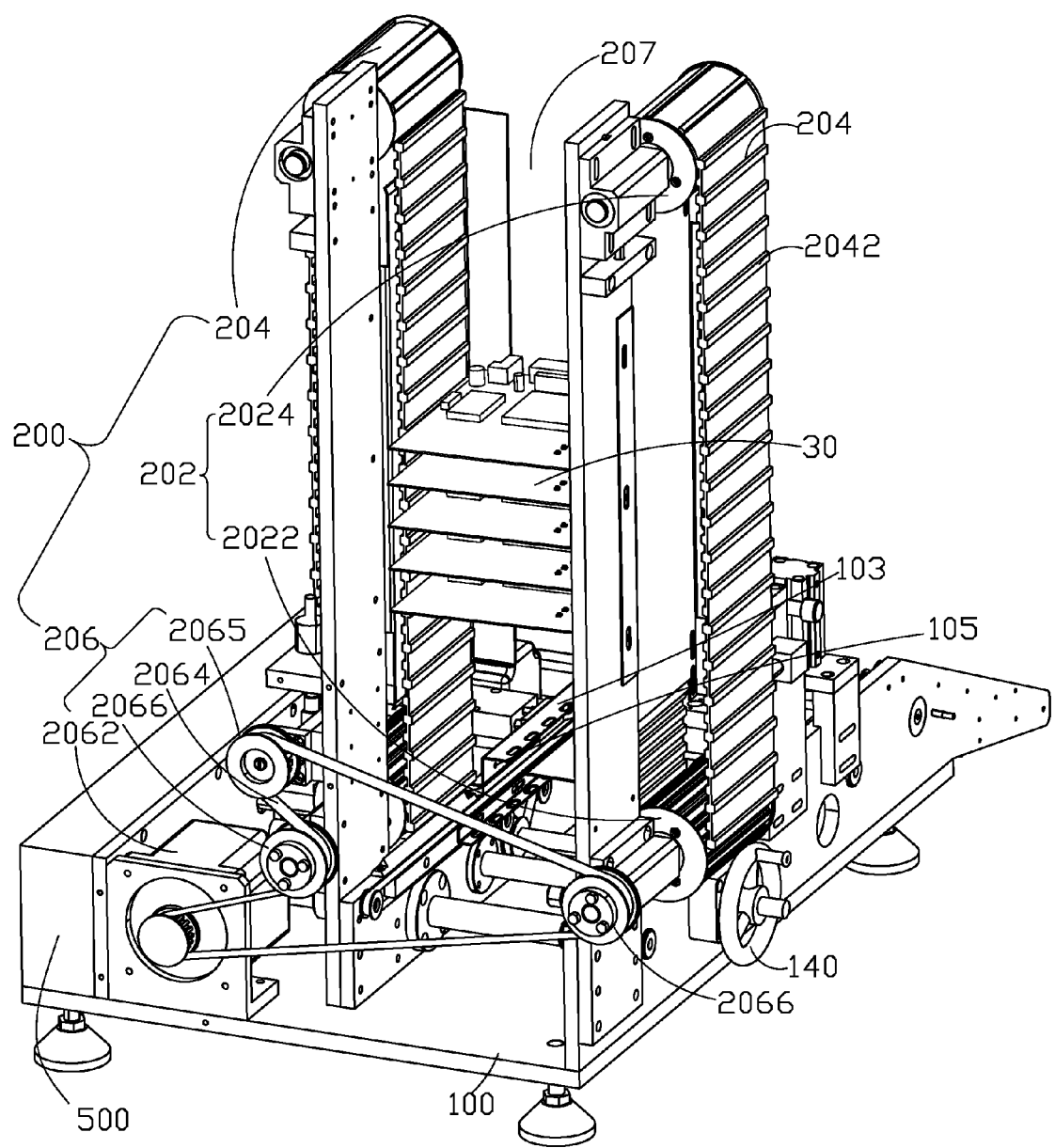
FIG. 2 is an exploded perspective view from a second direction of the PCB testing system of FIG. 1.
Figure 3:
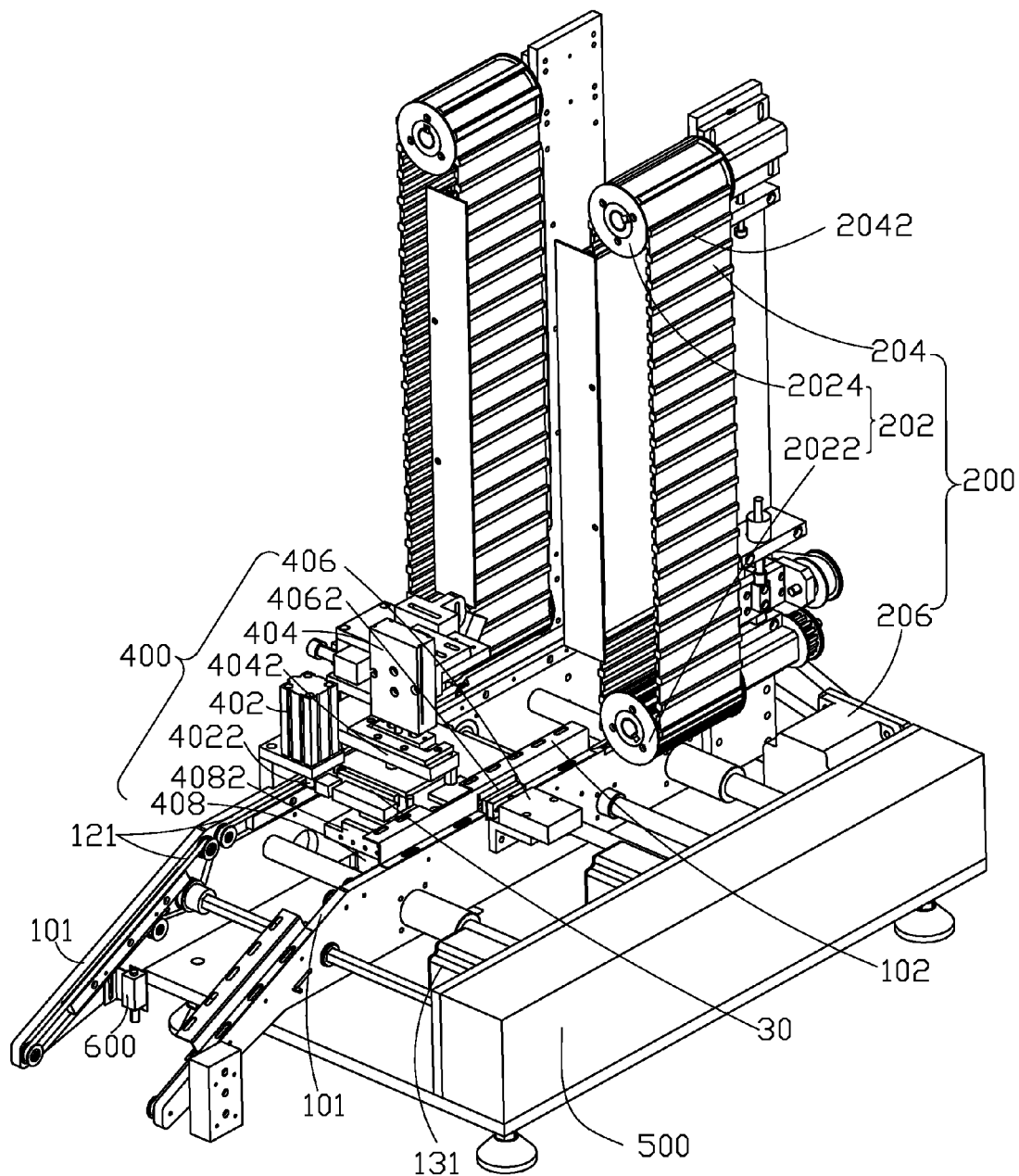
FIG. 3 is an exploded perspective view from a third direction of the PCB testing system of FIG. 1.

Referring to FIG. 1-FIG. 3, a PCB testing system includes a base 100 comprising a PCB transmission guideway 120. The PCB transmission guideway 120 includes a pair of guides 101 opposite to and parallel with each other, a plurality of rollers 102 mounted on opposite inner sides of the pair of guides 101, at least one pair of feed belts 121 mounted on the pair of rollers 102, and at least one motor 131 that drives the at least one pair of feed belts 121 around the plurality of rollers 102. In the illustrated embodiment, two pairs of feed belts 121 are accordingly driven by two motors 131, where each of two motors 131 drives one pair of feed belts 121 to work.

The PCB transmission guideway 120 is used to convey a plurality of PCBs 30 in production process, where two opposite edges of the PCBs 30 are supported on the at least one pair of feed belts 121. In the illustrated embodiment, a distance between the pair of guides 101 is substantially greater than that between the opposite edges of the PCBs 30, so as to enable smooth conveyance of the PCB transmission guideway 120.

The distance between the pair of guides 101 is adjustable to convey various PCBs with different sizes. In the illustrated embodiment, a hand wheel 140 located on one side of the pair of guides 101 is capable of adjusting the distance between the pair of guides 101.

A PCB delivery apparatus 200, a testing apparatus 400 and a control unit 500 are located on the base 100, comprise the PCB testing system, where the PCB delivery apparatus 200 is located at a first station of the PCB transmission guideway 120, and the testing apparatus 400 is located at a second station, next to the first station, of the PCB transmission guideway 120. The control unit 500 controls operation of the PCB delivery apparatus 200 and the testing apparatus 400.

The PCB delivery apparatus 200 includes two gear groups 202, a pair of enclosed transmission belts 204, and a driver 206. The two gear groups 202 are located on two opposite sides of the PCB transmission guideway 120, in the illustrated embodiment, the two gear groups 202 are fixed on two sides of the pair of guides 101, respectively. The pair of transmission belts 204 is geared onto and driven by the two gear groups 202. Transmission belts 204 are parallel and respectively perpendicular to the PCB transmission guideway 120, so as to define a PCB accommodation space 207 therebetween, suitable to receive the PCBs 30 (shown in FIG. 2). A distance between the pair of transmission belts 204 is adjustable according to that between the pair of guides 101, such that the PCB accommodation space 207 can receive PCBs 30 of different sizes. Each transmission belt 204 includes a plurality of projections 2042, located on an outer surface thereof. The projections 2042 of the pair of the transmission belts 204 are horizontal and correspondingly opposite, to support the PCBs 30 thereon. The projections 2042 on each of the transmission belts 204 are uniformly spaced with each other. Each of the PCBs 30 is received in the PCB accommodation space 207 and supported on two opposite projections 2042.

Each of the two gear groups 202 includes a master gear 2022 and at least one driven gear 2024 parallel with the master gear 2022 axially. In the illustrated embodiment, the at least one driven gear 2024 and the corresponding transmission belt 204 are driven by the corresponding master gear 2022. The driver 206 rotates the master gear 2022 synchronously and inversely. When the projections 2042 supporting one of the plurality of PCBs 30 approach the PCB transmission guideway 120, the projections 2042 move away from each other and to the bottom of the corresponding transmission belts 204, and the PCB 30 supported on the pair of projections 2042 drops onto the PCB transmission guideway 120 for further conveyance.

In the illustrated embodiment, at least one sensor 105 located on the base 100 and below the pair of transmission belts 204 detects contact of the PCBs 30 and subsequently transmits a notification to the control unit 500, which directs the driver 206 to stop driving the master gears 2022 accordingly. When the PCB 30 is conveyed to the testing apparatus 400, the control unit 500 directs the driver 206 to continue driving the two master gears 2022.

In the illustrated embodiment, the driver 206 includes a step motor 2062, two common gears 2066, a mediation gear 2065 and a belt 2064. The two common gears 2066 are coaxial to and drive the two master gears 2022, respectively. The belt 2064 is reeled onto a gear shaft of the step motor 2062, one of the two common gears 2066, the mediation gear 2065 and the other of the two common gears 2066 in turn, forming a closed loop, to rotate the two common gears in different directions. Accordingly, the common gears 206 rotate the master gear 2022 in synchronous and inverted modes.

The testing apparatus 400 tests the PCBs 30 fed thereto by the PCB delivery apparatus 200. The testing apparatus 400 includes a front positioning cylinder 402, an upper positioning cylinder 404, a side positioning cylinder 406 and a lower positioning cylinder 408. When a PCB 30 is conveyed to the testing apparatus 400, the front positioning cylinder 402 drives a front positioning block 4022 to move down and stop the PCB 30, the side positioning cylinder 406 drives a side positioning block 4062 to contact the PCB 30, and the upper positioning cylinder 404 and the lower positioning cylinder 408 drive an upper positioning plate 4042 and a lower positioning plate 4082, respectively, to move toward and contact the PCB 30, which is accordingly positioned in the testing apparatus 400. The upper and lower positioning plates 4042, 4082 each include a test interface, such as a plurality of pins, facing the PCB 30. When the upper and lower positioning plates 4042, 4082 position the PCB 30, the test interfaces thereof connect to the PCB 30 to test the PCB 30.

The control unit 500 electrically connects to and controls the testing apparatus 400 to position and test the PCBs 30. If acceptable test results are obtained, the control unit 500 directs the PCB to be conveyed to a subsequent station. If test results are unacceptable, the control unit 500 issues a notification to retrieve the failed PCB 30. A stop mechanism 600 disposed on the base 100 electrically connects to the control unit 500. When the control unit 500 issues the notification, the stop mechanism 600 receives a control signal from the control unit 500 to approach the PCB transmission guideway 120 and stop the failed PCB 30, which is then retrieved.

In the illustrated embodiment, at least one sensor 105 located on the base 100 near testing apparatus 400 electrically connects to and communicates with the control unit 500. When a PCB 30 received in the testing apparatus 400 is detected, the control unit 500 directs the testing apparatus 400 to operate accordingly.

One or more brackets 103 are fixed on the pair of guides 101, and sensors described are installed on the bracket 103.

The PCB testing system as disclosed stores and feeds the PCBs 30 automatically via the PCB delivery apparatus 200, and positions and tests the PCBs 30 automatically via the testing apparatus 400, providing increased convenience and efficiency.

While exemplary embodiments have been described, it should be understood that they have been presented by way of example only and not by way of limitation. The breadth and scope of the disclosure should not be limited by the described exemplary embodiments, but only in accordance with the following claims and their equivalents.

What is claimed is:

1. A printed circuit board (PCB) delivery apparatus, to deliver a plurality of PCBs to a PCB transmission guideway, the PCB delivery apparatus comprising:
    two gear groups, located on two opposite sides of the PCB transmission guideway, each of the two gear groups comprising a master gear;
    a pair of transmission belts, geared onto and driven by the two gear groups, wherein the pair of transmission belts are respectively perpendicular to the PCB transmission guideway and define a PCB accommodation space therebetween suitable to receive the plurality of PCBs, and wherein each transmission belt comprises a plurality of projections, located on an outer surface of the transmission belt, and the projections of the pair of the transmission belts are horizontal and correspondingly opposite to support the PCBs thereon; and
    a driver, to rotate the two master gears of the two gear groups synchronously and inversely;
    wherein when the projections supporting one of the plurality of PCBs approach the PCB transmission guideway, the projections move away from each other, such that the PCB supported thereon drops onto the PCB transmission guideway.

2. The PCB delivery apparatus as claimed in claim 1, wherein the projections on each of the transmission belts are uniformly spaced from each other.

3. The PCB delivery apparatus as claimed in claim 2, wherein a distance between the pair of transmission belts is adjustable corresponding to a width of the PCB transmission guideway.

4. The PCB delivery apparatus as claimed in claim 3, further comprising at least one sensor located below the pair of transmission belts to detect one of the plurality of PCBs dropping, and subsequently issuing a notification to a control unit;
    wherein in response to receiving the notification, the control unit directs the driver to stop driving the master gears; and
    wherein in response to the dropping PCB being conveyed onward to a next station, the control unit directs the driver to continue to drive the two master gears.

5. The PCB delivery apparatus as claimed in claim 1, wherein the driver comprises:
    a step motor, comprising a gear shaft;
    two common gears, to coaxially drive the two master gears, respectively;
    a mediation gear; and
    a belt, reeled on the gear shaft, the two common gears, the mediation gear, to drive the two common gears to rotate in different directions.

6. A PCB testing system, comprising:
    a PCB transmission guideway; and
    a PCB delivery apparatus, delivering PCBs to the PCB transmission guideway, the PCB delivery apparatus comprising:
    two gear groups, located on two opposite sides of the PCB transmission guideway, each of the two gear groups comprising a master gear;
    a pair of transmission belts, geared onto and driven by the two gear groups, wherein the pair of transmission belts is respectively perpendicular to the PCB transmission guideway so as to define a PCB accommodation space therebetween suitable to receive the PCBs, and wherein each transmission belt comprises a plurality of projections, located on an outer surface of the transmission belt, the projections of the pair of the transmission belts being horizontal and correspondingly opposite to support the PCBs thereon; and
    a driver, to rotate the two master gears of the two gear groups synchronously and inversely;
    wherein when the projections supporting one of the plurality of PCBs approach the PCB transmission guideway, the projections move away from each other, such that the PCB supported thereon drops onto the PCB transmission guideway.

7. The PCB testing system as claimed in claim 6, wherein the projections on each of the transmission belts are uniformly spaced from each other.

8. The PCB testing system as claimed in claim 7, wherein the PCB transmission guideway comprises a pair of guides parallel to each other, a plurality of rollers mounted on opposite inner sides of the pair of guides, at least one pair of feed belts mounted on the plurality of rollers, and at least one motor driving the at least one pair of feed belts on the plurality of rollers.

9. The PCB testing system as claimed in claim 8, wherein two opposite edges of the PCBs are supported on the at least one pair of feed belts during conveyance, and a distance between the pair of guides is substantially greater than that between the opposite edges of the PCBs.

10. The PCB testing system as claimed in claim 9, wherein the distance between the pair of guides is adjustable corresponding to a width of the PCB transmission guideway to convey PCBs of different sizes.

11. The PCB testing system as claimed in claim 10, further comprising at least one sensor located below the pair of transmission belts to detect a PCB dropping, and subsequently issuing a notification to a control unit;
    wherein in response to receiving the notification, the control unit directs the driver to stop driving the master gears; and wherein in response to the dropping PCB being conveyed onward to a next station, the control unit directs the driver to continue to drive the two master gears.

12. The PCB testing system as claimed in claim 11, further comprising one or more brackets fixed on the pair of guides, and the at least one sensor installed on the bracket.

13. The PCB testing system as claimed in claim 6, further comprising a testing apparatus, located on a next station to the first station of the PCB transmission guideway to position and test the PCBs fed by the PCB delivery apparatus.

14. The PCB testing system as claimed in claim 13, wherein the testing apparatus comprises a front positioning cylinder, an upper positioning cylinder, a side positioning cylinder and a lower positioning cylinder;

wherein when one of the PCBs is conveyed to the testing apparatus, the front positioning cylinder drives a front positioning block to move down and contact the PCB, the side positioning cylinder drives a side positioning block to contact the PCB, and the upper positioning cylinder and the lower positioning cylinder drive an upper positioning plate and a lower positioning plate respectively to move and contact the PCB, which is thereby positioned;

wherein one or both of the upper and lower positioning plates comprises test interfaces, and when positioning the PCB, the test interfaces connect to the PCB.

15. The PCB testing system as claimed in claim 14, further comprising a control unit, used to control the testing apparatus to position and test the PCBs, wherein the PCBs having acceptable test results are conveyed to the next station, and if the PCBs fail testing, the control unit issues a notification to retrieve the failed PCB.

16. The PCB testing system as claimed in claim 15, further comprising a stop mechanism electrically connected to the control unit, wherein when the control unit receives the notification, the stop mechanism receives a control signal from the control unit to stop progress of the failed PCB.

17. The PCB testing system as claimed in claim 16, further comprising at least one sensor located on the base near the testing apparatus, electrically connected to and communicating with the control unit;

wherein when the at least one sensor detects a PCB received in the testing apparatus, the control unit directs the testing apparatus to begin operation.

18. The PCB testing system as claimed in claim 17, further comprising one or more brackets fixed on the pair of guides to bear the at least one sensor thereon.

* * * * *